United States Patent [19]

Arnold et al.

[11] 4,099,257
[45] Jul. 4, 1978

[54] MARKOV PROCESSOR FOR CONTEXT ENCODING FROM GIVEN CHARACTERS AND FOR CHARACTER DECODING FROM GIVEN CONTEXTS

[75] Inventors: Richard Fairbanks Arnold, Palo Alto; Yitzhak Dishon; Norman Ken Ouchi, both of San Jose; Marshall I. Schor, Menlo Park, all of Calif.

[73] Assignee: International Business Machines Corporation, Armonk, N.Y.

[21] Appl. No.: 720,019

[22] Filed: Sep. 2, 1976

[51] Int. Cl.² ............................................. G06F 5/00
[52] U.S. Cl. ............................ 364/900; 340/347 DD
[58] Field of Search ............... 340/347 DD; 235/310; 364/900, 749

[56] References Cited

U.S. PATENT DOCUMENTS

| | | | |
|---|---|---|---|
| 3,651,516 | 3/1972 | Andreae | 340/347 DD |
| 3,675,211 | 7/1972 | Raviv | 340/347 DD |
| 3,675,212 | 7/1972 | Raviv et al. | 340/347 DD |
| 3,701,108 | 10/1972 | Loh et al. | 340/347 DD |
| 3,701,111 | 10/1972 | Cocke et al. | 340/347 DD |
| 3,883,847 | 5/1975 | Frank | 340/347 DD |

*Primary Examiner*—Leo H. Boudreau
*Attorney, Agent, or Firm*—R. Bruce Brodie

[57] ABSTRACT

In an apparatus for generating variable length codewords $c(a_i)$ and $c(a_j)$ responsive to corresponding fixed length codewords $b(a_i)$ and $b(a_j)$, where $a_i$ and $a_j$ are source alphabet characters, $a_i \epsilon A_1$ and $a_j \epsilon A_2$, ambiguity arises whenever any fixed length character to be encoded can instantaneously represent source characters $a_i$ and $a_j$ drawn from two or more dissimilar alphabets i.e. $A_1$ or $A_2$. This is resolved by the inclusion of a Markov processor in combination with the apparatus. The processor establishes the point in the sequence when transitions occur between fixed length characters in one alphabet to fixed length characters in another alphabet by the message context. The processor includes a map of state and transition paths. This map models certain statistical regularities of runs of fixed code elements and the relative likelihood that an ambiguous fixed code character appearing in a first run belongs to a given alphabet. The processor, starting from an arbitrary initial position, tracks any given run of fixed code characters applied to the encoder in terms of a succession of states and paths.

5 Claims, 11 Drawing Figures

AMBIGUOUS CHARACTER OCCURRENCE  ALPHABET ENCODE/DECODE RULE
GIVEN  $a_i \in A_1$  $a_j \in A_2$
$b(a_i) b(a_i) --- b(a_i)$  STAY IN $A_1$
$b(a_i) b(a_i) --- ⓟ$  " " "
" " $--- ⓟⓟ$  GO TO $A_2$
$b(a_j) b(a_j) --- b(a_j)$  STAY IN $A_2$
" " $--- ⓟ b(a_j)$  " " "
" " $--- ⓟⓟⓟ b(a_j)$  " " "
$b(a_j) b(a_j) --- ⓟⓟⓟⓟ$  GO TO $A_1$
FIG. 1A
| PRESENT STATE r | NEXT STATE of "r" if | |
|---|---|---|
| | $S_i=1$ | $S_j=0$ |
| 1 | 2 | 1 |
| 2 | 3 | 1 |
| 3 | 4 | 2 |
| 4 | 5 | 2 |
| 5 | 5 | 6 |
| 6 | 5 | 1 |
STATE TRANSITION TABLE STORED IN STATE CONTROLLER
FIG. 1B
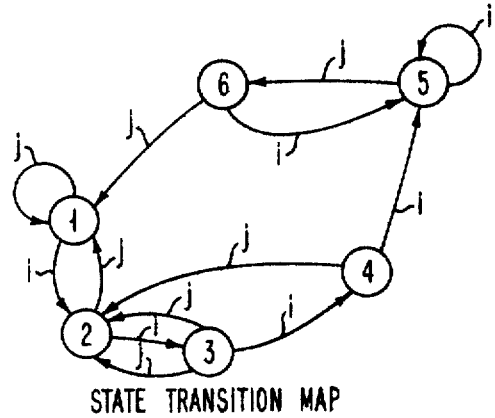
STATE TRANSITION MAP
FIG. 1C
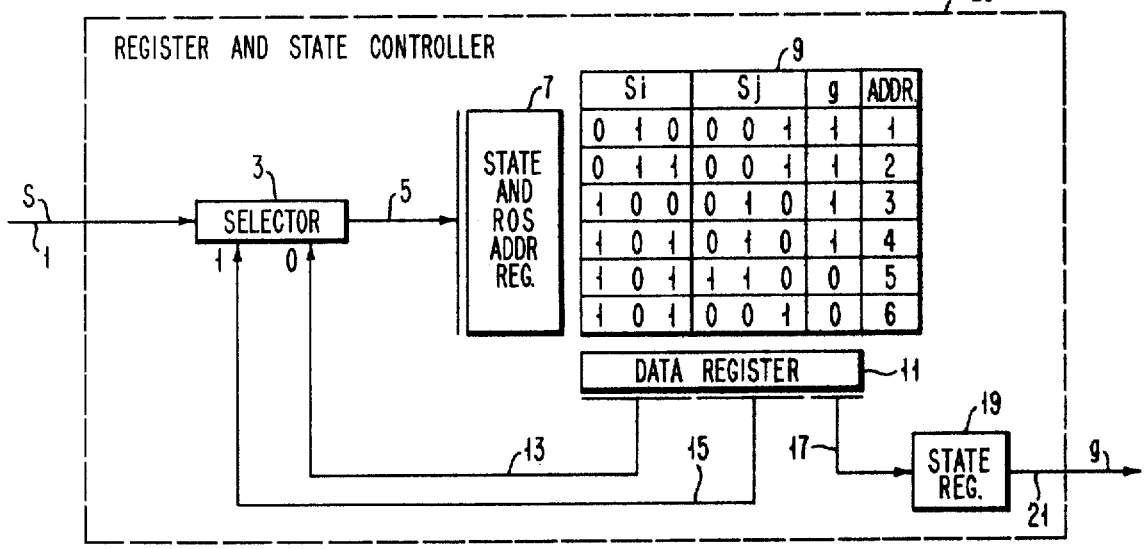
FIG. 2

| b(a) FIXED | c(aⱼ) VARIABLE (g=0, aⱼ ∈ A₁) | | L LENGTH | S PATH | c(aⱼ) VARIABLE (g=1, aⱼ ∈ A₂) | | | L LENGTH | S PATH |
|---|---|---|---|---|---|---|---|---|---|
| 0 | 0 0 | N/A | 2 | i | 1 | 1 | 1 | 6 | i |
| 1 | 0 1 | N/A | 2 | i | 1 | 1 | 1 | 6 | i |
| 2 | 1 0 | 0 | 3 | i | 1 | 1 | 1 | 6 | i |
| 3 | 1 0 | 1 | 3 | i | 1 | 1 | 0 | 3 | j |
| 4 | 1 1 | 1 | 6 | i | 1 | 1 | 1 | 6 | j |
| 5 | 1 1 | 1 | 6 | j | 0 | N/A | N/A | 1 | j |
| 6 | 1 1 | 1 | 6 | j | 1 | 0 | N/A | 2 | j |
| 7 | 1 1 | 0 | 3 | i | 1 | 1 | 1 | 6 | i |

NOTE 111 bbb = SIX BIT SEQUENCE DENOTING FIXED CODE
N/A = BIT POSITION NOT USED TO DEFINE CODE WORD <u>ENCODER ROS CONTENTS</u>

FIG. 3A

| c(aⱼ) VARIABLE (g=0, aⱼ ∈ A₁) | | | L LENGTH | S PATH | b(aⱼ) FIXED | CLEAR/ COMPRESS | c(aⱼ) VARIABLE (g=1, aⱼ ∈ A₂) | | | L LENGTH | S PATH | b(aⱼ) FIXED | CLEAR/ COMPRESS |
|---|---|---|---|---|---|---|---|---|---|---|---|---|---|
| 0 | 0 | 0 | 2 | i | 0 | 0 | 0 | 0 | 0 | 1 | j | 5 | 0 |
| 0 | 0 | 1 | 2 | i | 0 | 0 | 0 | 0 | 1 | 1 | j | 5 | 0 |
| 0 | 1 | 0 | 2 | i | 1 | 0 | 0 | 1 | 0 | 1 | j | 5 | 0 |
| 0 | 1 | 1 | 2 | i | 1 | 0 | 0 | 1 | 1 | 1 | j | 5 | 0 |
| 1 | 0 | 0 | 3 | i | 2 | 0 | 1 | 0 | 0 | 2 | j | 6 | 0 |
| 1 | 0 | 1 | 3 | i | 3 | 0 | 1 | 0 | 1 | 2 | j | 6 | 0 |
| 1 | 1 | 0 | 3 | i | 7 | 0 | 1 | 1 | 0 | 3 | j | 3 | 0 |
| 1 | 1 | 1 | 6 | ENCODER | X | 1 | 1 | 1 | 1 | 6 | ENCODER | X | 1 |

X = NEXT 3 BITS ARE FIXED CODE b(a)

<u>DECODER ROS CONTENTS</u>

FIG. 3B

FIXED TO VARIABLE LENGTH ENCODER WITH
REGISTER AND CYCLE DEFINITION

MARKOV PROCESSOR FOR CONTEXT ENCODING FROM GIVEN CHARACTERS AND FOR CHARACTER DECODING FROM GIVEN CONTEXTS

BACKGROUND OF THE INVENTION

This invention relates to fixed to variable length word encoding and to variable to fixed length word decoding. More particularly, the invention relates to mechanisms for resolving ambiguities when transitions between substrings of different alphabets occur. This enables the assignment of an optimum variable length word in encoding. It further enables the parsing of comma free bit streams of variable length code words and for resolving ambiguities between said variable length words and their fixed length representations in decoding.

Fixed to variable length encoding consists of assigning a variable length code word $c(a)$ to the appearance of a fixed length codeword $b(a)$. Each fixed length code word represents a character "$a$" in a source alphabet A.

Since $b(a)$ can represent both a character in $A_1$ and $A_2$, ambiguity arises in both the encoding and decoding processes.

The encoder must determine when a transition from one alphabet to another has occurred to make an optimum variable length code assignment, $c(a)$. The decoder must determine which alphabet was selected by the encoder to parse the comma free bit stream and to properly reassign the fixed length code word $b(a)$ to the received variable length code word $c(a)$.

There exists cost and performance advantages in the machine storage, transfer and manipulation of character alphabets using equal fixed length codewords. Among the advantages are uniformity and standardization of storage cell/register sizes, the number of conductors for data busing, and the reduced or non-existant informational overhead to track character boundaries. However, variable length representation is attractive for transmission and storage, where the average compressed codeword length may be less than the fixed code word length.

English text may be machine described by fixed length code words from several different alphabets. For example, there can exist an alphabet of upper case characters A, B, . . . , Z; an alphabet of lower case characters $a, b, \ldots, z$; or an alphabet of numbers and symbols 1, 2, 3, . . . , %, +, etc. It is possible to construct a fixed length code of length L whose capacity are $=2^L \geq T =$ the number of upper case characters plus the number of lower case characters, etc. However, where $2^L \leq T$, then some fixed length codewords $b(a)$ will be ambiguous. Indeed, the cost tradeoffs may be such that the increase in length L of $b(a)$ may be far more expensive than the use of mechanisms for resolving the ambiguities.

As previously mentioned, fixed to variable length encoding becomes attractive where the variable length codeword representation is a compressed version of the former. Compression is achieved by employing certain statistical regularities connected with the source alphabet. The most often used regularity is the ordering of characters on a relative frequency of occurrence and assigning the shortest length codewords to the most frequently occurring characters. This can lead to the rarest occurring characters having very long codewords. The upper limit of codeword length is that of the register size. To avoid the necessity of long registers, those infrequent characters whose variable codewords require more than a fixed register's length would be transmitted with a specific variable length prefix followed by the character in the clear, i.e., not encoded. This means that the encoder output consists of frequent variable length codeword sequences and infrequent fixed length words with the special prefix.

The encoder output can be viewed as a serial, comma-free bit stream insofar as the variable length words are concerned. Placing commas, separations, between the variable words would sharply reduce compression advantage.

The prior art is replete with many examples of fixed and variable length encoders. For example, Blasbalg, U.S. Pat. No. 3,237,170, describes an adaptive compactor that in effect varies the variable length code word assignments as the statistics of the relative frequency of occurrence of the source alphabet change. Wernikoff, U.S. Pat. No. 3,394,352, applies each fixed length word in parallel to differently structured encoders. He uses the shortest codeword from among the plurality with a tag to permit decoding.

Although Blasbalg changes his output codewords, he still preserves a unique one-to-one relationship between each input and output character. The same can be said of Wernikoff. In the latter case, the output tag identifies the encoder/decoder to be used. In contrast, the problem addressed by this invention is that of resolving ambiguous terms, first at the encoder and then at the decoder.

SUMMARY OF THE INVENTION

The invention is based on the observation that a Markov processor possesses a "remembrance" property and that its state-to-state transitions can be modified to reflect empirically derived statistics concerning runs of fixed and variable length code words. This is used to establish context and identify the substring alphabet. For instance, the likelihood of occurrence that a present fixed length code word is an uppercase character given a run of K upper case characters is small. Another instance might be that the expectancy of $b(a)$ is assignable to an upper case character after a run of any length of lower case characters might also be quite negligible. These observations yield a series of decision rules for treating ambiguous characters as belonging to the same or different alphabet as the run of preceding terms. The exact rules will vary as the empirically derived statistics and source alphabets vary.

The invention is embodied in an apparatus for generating variable length codewords $c(a_i)$ and $c(a_j)$ responsive to corresponding fixed length codewords $b(a_i)$ and $b(a_j)$, where $a_i$ and $a_j$ are source alphabet characters, $a_i \in A_1$ and $a_j \in A_2$. The improvement includes a Markov processor coacting with selected means in the apparatus for resolving ambiguities by character sequence context recognition arising whenever ones of any sequence of fixed length characters to be encoded may be concurrently either $b(a_i)$ or $b(a_j)$ and are appended to sequences from a known alphabet. The processor includes an "$r$" state register, and state transition means responsive to a first control signal for changing a given present state of the register to one of a preselected number $<r$ next states, said means include means for generating a second control signal. The apparatus also includes means responsive to each fixed length codeword for generating an ordered m-tuple consisting of variable length codewords, length attributes, and the first control signal, and means for selecting and applying one of the variable length codewords from the m-tuple to the apparatus output according to the second control signal. To complete the control, there are provided means for applying the first control signal to the state transition means.

The state transition means includes a map of the Markov processor states and transition paths. This map models certain statistical regularities of runs of fixed code elements and the relative likelihood that one or more consecutive ambiguous terms appearing in a certain type of run belongs to a given alphabet and should be encoded/decoded accordingly. The processor starts from an arbitrary initial state and tracks any given run of $b(a)$'s applied thereto in terms of a succession of states and paths. Thus, for any given $b(a)$ and present machine state $r$, then the alphabet A, $c(a)$, and path S can be obtained by table lookup. $c(a)$ represents the instantaneous encoder output. Significantly, the state transition means causes the register to change from its present state to a next state according to the map and the table extracted value S applied to said means.

This invention takes advantage of the fact that the number of actual machine states can be mapped into a smaller number of states for representational purposes. This is due to the fact that a run of characters in the same alphabet will place a machine in one or another of the subset of machine states. This reduces the amount of memory and processing required to perform encoding/decoding.

In receiving a series of variable length codewords as a comma-free bit stream, the decoder includes encoding logic and a Markov processor for both parsing the characters in the stream and for resolving whether a given $c(a)$ represents $b(a_i)$ or $b(a_j)$. In this regard, the Markov processor traverses the same sequence of states as the encoder Markov processor when encoding the fixed length word stream.

BRIEF DESCRIPTION OF THE DRAWING

FIG. 1A depicts runs of alphabetically designated fixed length code words with and without ambiguous terms together with rules of action.

FIGS. 1B and 1C show a finite state machine implementing the rules of 1A in both tabular (1B) and graphic (1C) forms.

FIG. 2 sets forth a register for storing the identity of the present machine state and a state-to-state tracking mechanism.

FIGS. 3A and 3B, respectively, represent the table contents of an encoding and decoding read only store (ROS).

DESCRIPTION OF THE PREFERRED EMBODIMENT

Figure 4:
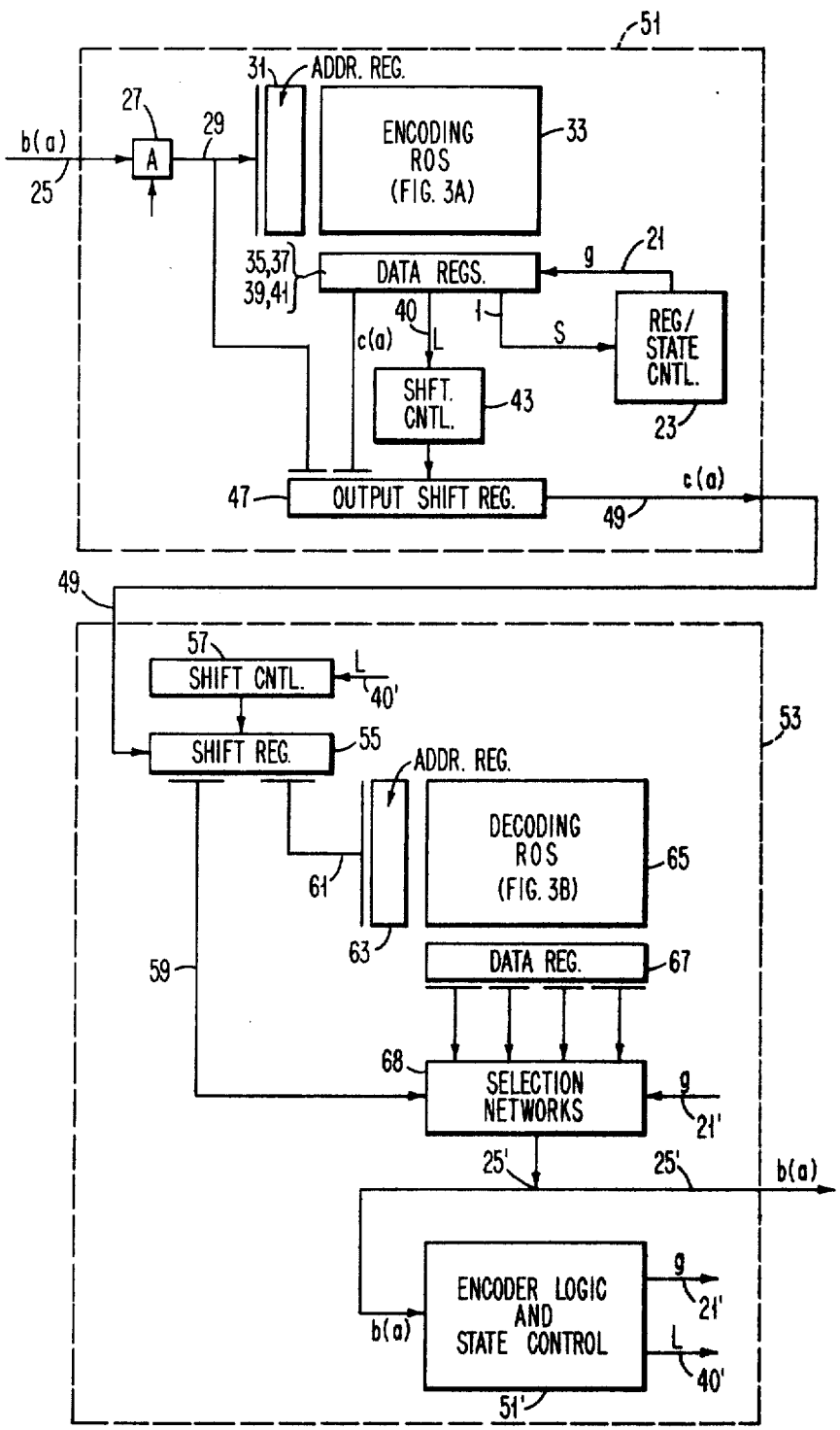
FIG. 4 sets forth the fixed to variable length word encoder and decoder in system relation.

It is well known that variable length codewords C may be assigned, one to one, to each member of a given alphabet. The length L of the codeword is inversely related to the relative frequency of occurrence P of the term in the alphabet. Indeed, algorithms for minimizing the average length of the variable length codewords assigned to the terms of an alphabet are well represented in the art. See Raviv, U.S. Pat. No. 3,675,211; U.S. Pat. No. 3,675,212; Cocke et al, U.S. Pat. No. 3,701,111. These are based in whole or in part on the work of Huffman, "A Method for the Construction of Minimum Redundancy Codes", Proceedings of the IRE, September 1952, pages 1098-1111.

Referring now to Table 1, there are shown two arbitrary alphabets $A_1$ and $A_2$. Each member $a_i$ of $A_1$, symbolized $a_i \epsilon A_1$ consists of a number 1, 2, 3, ..., 7. Likewise, $a_j \epsilon A_2$ consists of a lower case Greek letter. The relative frequency $P(a_i)$ is followed by an optimum length Huffman encoded variable length word $c(a_i)$. The length $L(a_i)$ of the codeword $C(a_i)$ is listed in the next column for convenience. Finally, the expected length for each entry is formed from the product $P(a_i) \times L(a_i)$. Each Huffman code was independently calculated for each alphabet. Note, the minimum average Huffman codeword length $L(a_i)=0.34$ bits per symbol while $L(a_j)=0.25$ bits per symbol. It follows that codes optimized in respect of their source alphabets are not optimized when strings are concatenated. Also to be noted is the length of the infrequently occurring members.

| $a_i \epsilon A_1$ | $P(a_i)$ | $c(a_i)$ | $L(a_i)$ | $P(a_i) \times L(a_i)$ | $a_j \epsilon A_2$ | $P(a_j)$ | $c(a_j)$ | $L(a_j)$ | $P(a_j) \times L(a_j)$ |
|---|---|---|---|---|---|---|---|---|---|
| 1 | 0.20 | 10 | 2 | 0.40 | t | .10 | 000 | 3 | .30 |
| 2 | 0.18 | 000 | 3 | 0.54 | u | .09 | 1010 | 4 | .36 |
| 3 | 0.10 | 011 | 3 | 0.30 | v | .09 | 1011 | 4 | .36 |
| 4 | 0.10 | 110 | 3 | 0.30 | w | .07 | 1001 | 4 | .28 |
| 5 | 0.10 | 111 | 3 | 0.30 | x | .06 | 1000 | 4 | .24 |
| 6 | 0.06 | 0101 | 4 | 0.24 | y | .03 | 11110 | 5 | .15 |
| 7 | 0.06 | 00100 | 5 | 0.30 | z | .01 | 11111110 | 8 | .08 |
| | | | Avg. = | $\frac{2.38}{7}$ = 0.34 bits/symbol | | | | Avg. = | $\frac{1.77}{7}$ = 0.25 |

TABLE I

Referring now to FIG. 1A, there is shown runs of alphabetically designated fixed length code words. For purposes of describing this invention, the runs, their statistics, and the source alphabets are wholly arbitrary. In the figure, each character $a_i$ is a member of alphabet $A_1$ and each character $a_j$ is a member of alphabet $A_2$.

In the figure, runs of fixed length codewords representing characters in the same alphabet $b(a_i), b(a_i), \ldots, b(a_i)$ imply that a machine should stay in the same alphabet for encoding/decoding the next character. Where a run is interrupted by a single "ambiguous character ?", the machine stays in the same alphabet. In this regard, an "ambiguous character" may be indicative of a change of alphabet. For runs in alphabet $A_1$ interrupted by two ambiguous terms ??, then the machine changes to the other alphabet $A_2$ for encoding/decoding the next character. For runs in $A_2$ interrupted by four successive ambiguous terms ????, terms, then transfer must be made to the other alphabet $A_1$.

Referring now to FIGS. 1B and 1C, there is shown a state transition table and map of a finite machine suitable for recognizing the runs of interest. The machine must have a sufficient number of states to "remember" to a depth of four. This is to take into account the transition rule governing runs of characters in alphabet $A_2$ interrupted by four ambiguous terms. The state transition table is formulated by assuming the apparatus exists in some initial internal state and then for each combination of runs, a new state is defined to which the apparatus should go from the initial state. Now, for each of the states into which the apparatus could have gone from the first state, this process of defining new states is repeated. A graphical version of the table is that of a map depicted along side thereof. The table and map may be read as follows.

Assume the apparatus is in initial state 1 and a character $b(a_i)$ is received for encoding, the machine would then move to state 2 over the path designated "$i$". If, instead, $b(a_j)$ had been received for encoding, the apparatus would stay in the same state 1.

Starting in state 1, if the apparatus received a succession of terms $b(a_i), b(a_i) . , , , . b(a_i)$, then it would move through successive internal states 1, 2, 3, 4 to and remain in state 5. Likewise, if the apparatus were in any other internal state and subject to a run of $b(a_j), \ldots , b(a_j)$, the apparatus would migrate back to state 1.

The paths connecting successive machine states are designated $s_i$ or $s_j$. Because a run of terms in the same alphabet will cause the apparatus to migrate to either state 1 or state 5, the internal machine states are connected. This aspect wil be discussed in connection with the description of FIG. 2.

Referring now to FIG. 2, there is shown the Markov processor 23 which coacts with selected means in the apparatus for resolving ambiguities by character sequence context recognition whenever ones of any sequence of fixed length characters to be encoded may be concurrently either $b(a_i)$ or $b(a_j)$ and append characters from a known alphabet. The processor includes an "$r$" state register 7 for storing the identity of the present state of the apparatus encoder and a state-to-state tracking mechanism (state transition means 23). In this regard, the contents of register 7, in addition to designating the internal state of the encoding/decoding apparatus, also serve to access the contents of a read only store 9. The read only store contents include the state transition table of FIG. 1B correlated with a second control signal "$g$". When ROS 9 is accessed by the contents of register 7, the data stored at the address is transferred to register 11. As is apparent from FIGS. 1B and 1C the next state is one of two possible states. Coded indication of the next two possible states are sent over respective paths 13 and 15 while the second control signal "$g$" is conducted over path 17 through state register 19 to path 21. This second control signal "$g$" is used in FIGS. 4 and 5a in selecting a given variable length codeword i.e. either $c(a_i)$ or $c(a_j)$ contained in the encoder data register 35 for transfer to the output register 47.

For example, suppose the present state of register 7 were 4. There would be transferred to data register 11 the binary equivalent of 5 and 2 and the "$g$" value of 1. The binary 5 value and the binary 2 value would be respectively applied to paths 13 and 15 and then to selector 3. The actual value of the next state for register 7 is determined by the $S_i$ or $S_j$ value on path 1. This causes selector 3 to connect either path 15 or path 13 to path 5 coupling register 7. As previously mentioned, the binary indication on path 1 represents the path selection for controlling the next state address to be transmitted from register 11 into register 7. If S is 0 on line 1, then the appropriate lefthand column entry from path 13 i.e. binary 5, is entered. If the 1 appears on line 1 then the appropriate righthand column entry i.e. binary 2 is selected.

Referring now to FIG. 4, there is shown an overall block diagram of a fixed to variable length encoder 51 coupled to a variable to fixed length decoder 53 over path 49. The encoder broadly comprises an encoding ROS 33 and associate accessing means, a state register and controller 23 to provide the state to state tracking and an output shift register 47 for placing the variable length codewords $c(a)$ on line 49. Decoder 53 includes a decoding ROS 65, shifting and accessing circuits, a data register 35 during load ROS data cycle ⓑ. Register together with selection networks 68 and encoder logic and state control element 51'. Each fixed length decoded word $b(a)$ is gated through the selection network 68 and applied simultaneously to output path 25' and element 51'.

The contents of encoding ROS 33 and decoding ROS 65 are representively set forth in FIGS. 3A and 3B. The details of register and state controller 23 are found in FIG. 2, while the selection networks 68 and 51' may be seen in FIG. 6A.

Referring now to FIG. 3A, there is shown a set of concordance tables in which for each $b(a_i)$, there is to be found a corresponding $c(a_i)$, a length L and path S. The same holds for each $b(a_j)$ and $c(a_j)$, L and S. Ambiguity may be found, for example, between $b(a_i) = 7$ and $b(a_j) = 3$ in that both $c(a) = 110$. Additionally, certain of the fixed code words such as $b(a_i) = 4, 5, 6$ and $b(a_j) = 0, 1, 2, 4, 7$ have $c(a_i)$ or $c(a_j) = 111$. The prefix 111 does not indicate ambiguity, but is a prefix denoting that the fixed code word $b(a)$ immediately follows and has not been encoded.

A reciprocal situation is represented in the decoder ROS contents of FIG. 3B. Here the sequence 111 is immediately denoted as being in fixed code. An additional column designates whether the $c(a), b(a)$ of interest represents clear or compressed text.

Figure 5A:
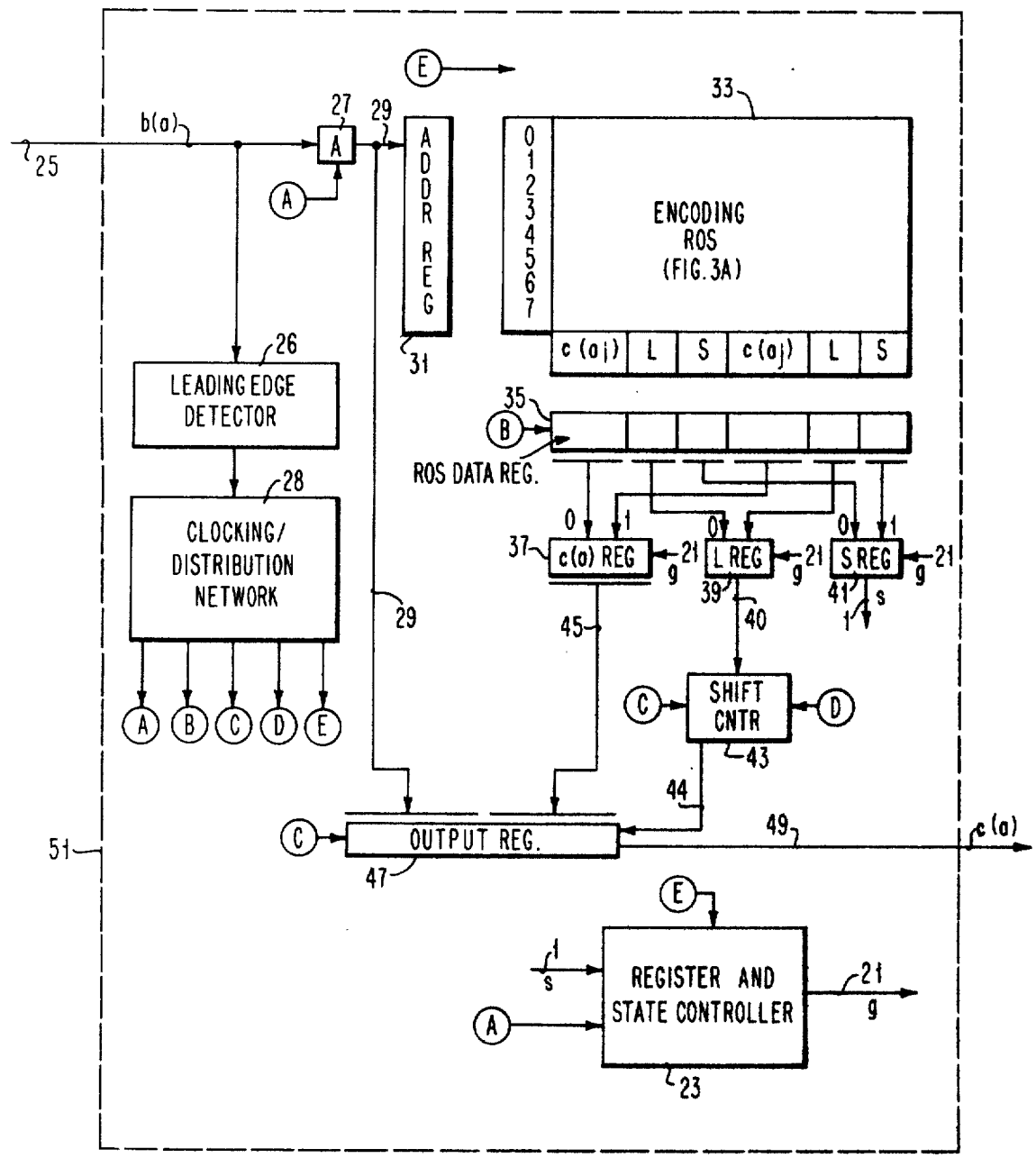
FIG. 5A is a logical depiction of the encoder emphasizing the register assignments and cycle definition of FIG. 5B.
Figure 5B:
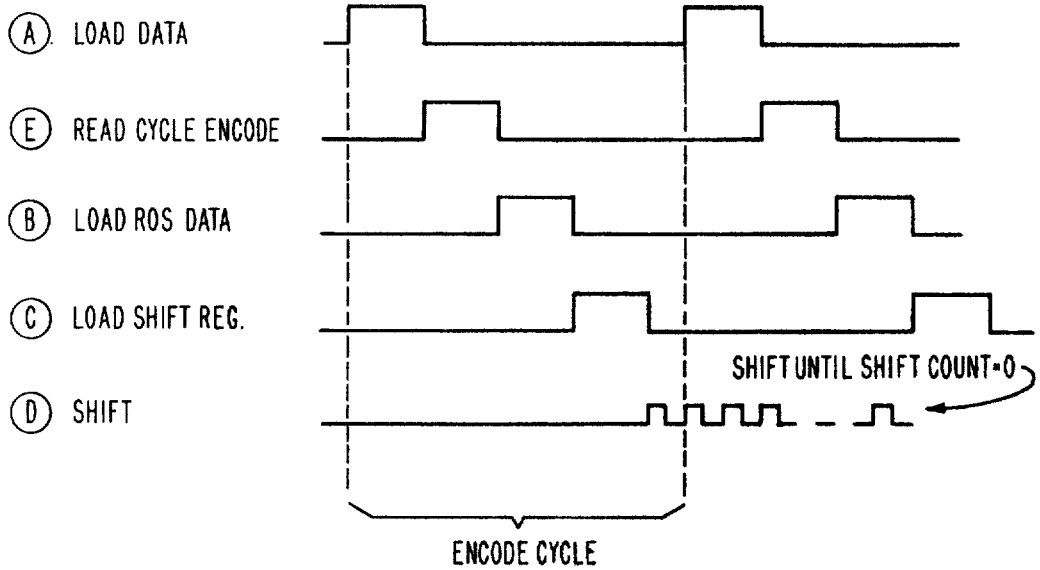

Referring now to FIG. 5A taken together with FIG. 5B, there is shown the detail for the fixed to variable length encoder 51 with register and cycle definition. In this embodiment, the bits representing each fixed length word $b(a)$ are assumed to be applied parallel by bit and serially by word. Upon detecting the pulse leading edges on path 25, a signal is provided by leading edge detector 26 to initiate the clocking actions of clocking and distribution network 28. The major cycles provided by network 28 are shown in FIG. 5B. In this regard, cycle Ⓐ causes data to be gated into address register 31 and a preselected portion of output register 47 over paths 29 through AND gate 27. The time between energizing gate 27 defines the encoding cycle. As soon as the data is loaded in register 31, the read cycle of the encoding ROS 33 begins. That is, the data stored at location defined by $b(a)$ is accessed and transmitted to 35 is partitioned so as to reflect one-to-one the variable length field $c(a_i)$, the length attribute L, the preferred path $s_i$ or $s_j$ and the corresponding fields with regard to $c(a_j)$.

Encoder 51 includes selection registers 37, 39, and 41. Selection register 37 responsive to the g signal on line 21 selects which one of the two variable length words will be placed in output register 47 over path 45. If $g = 0$, then $c(a_i)$ is inserted. If $g = 1$, then $c(a_j)$ in register 35 are transferred to register 47.

Selection register 39 selects that length attribute for controlling shift counter 43 corresponding to the selected C(A) in register 35. The same can be said for selection register 41 with respect to path S. After data register 35 has been loaded during cycle Ⓑ and the appropriate variable length word and associated parameters have been selected, the output register 47 is loaded during the load cycle Ⓒ. The contents of register 47 are serially applied to line 49 by shifting a predetermined number of stages out by decrementing the contents of shift counter 43 and providing a shifting signal over path 44 to register 47.

Figure 6B:
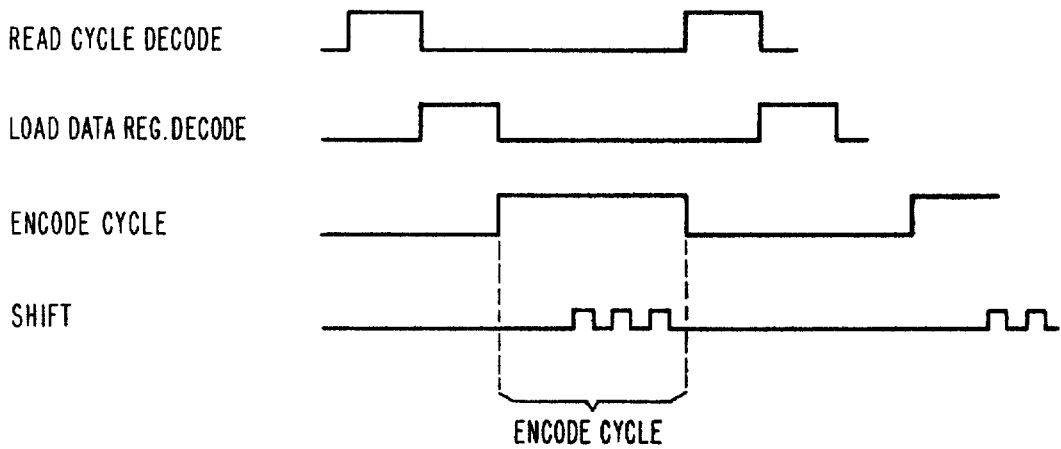
FIG. 6A is a logical depiction of the decoder emphasizing the register and selector circuit assignments together with the cycle definition of FIG. 6B.
Figure 6A:
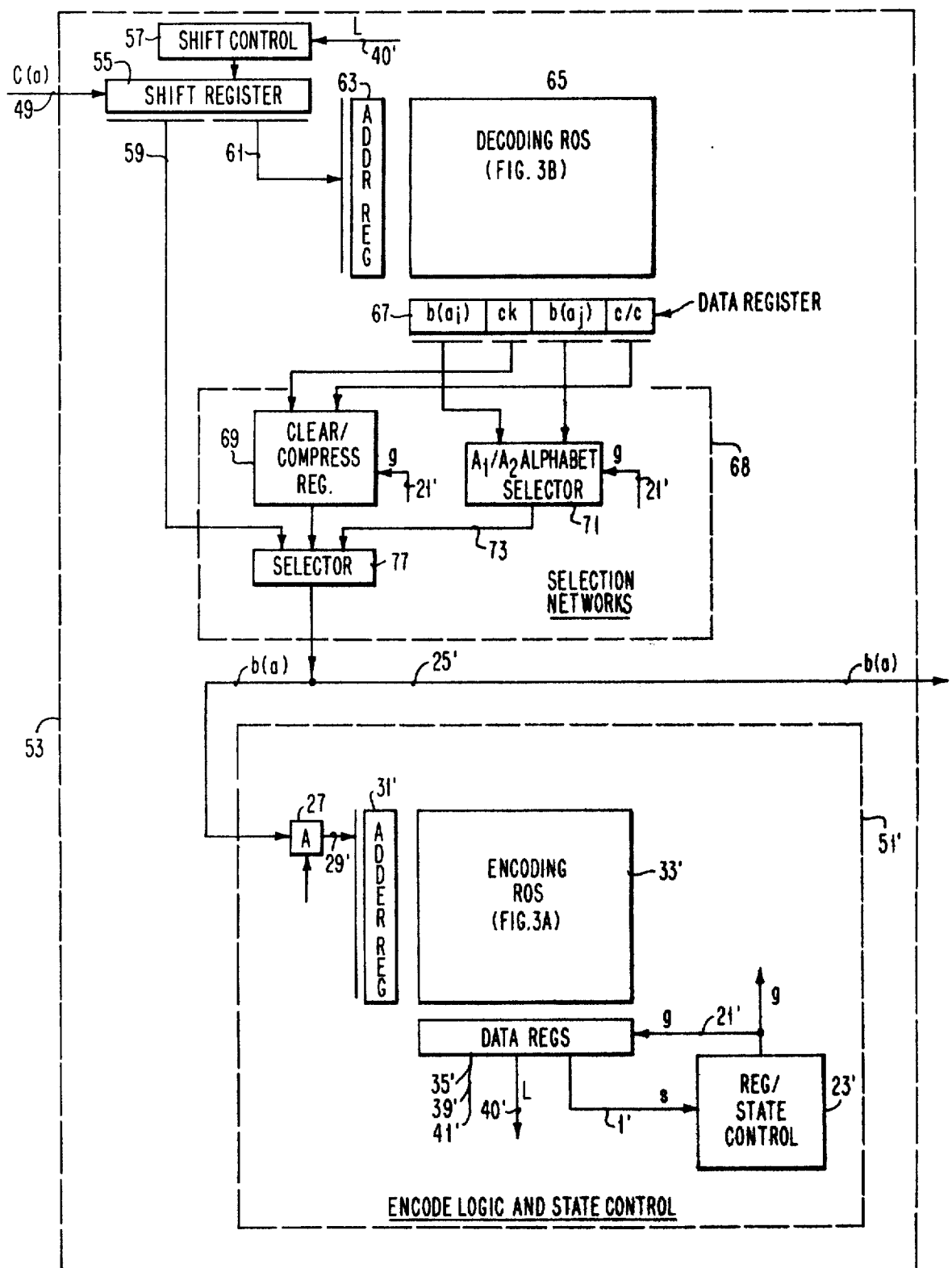

Referring now to FIG. 6A and 6B, there is shown a logic diagram of the decoder emphasizing register and selected circuit assignments together with the cycle definition in FIG. 6B. The variable length words $c(a)$, or less frequently, the fixed length $b(a)$ prefixed by 111, are serially received on path 49 and shifted into register 55. The contents of the predetermined number of positions in register 55 are loaded into address register 63 over path 61, while the remaining contents terminate in selector 77 in selection network 68 over path 59. Parenthetically, the amount of shifts during each decoding cycle is determined by the contents in register 39' located in encoder logic in state control 51'. The register passes a count which resides in shift control 57 as communicated over path 40'. The count is decremented to 0, each decrement resulting in a shift in the contents of register 55 from left to right by 1 position. As a consequence, the contents of register 63 are governed by those predetermined bit positions of register 55 that have been shifted under control of L. The contents of register 63 then access the decoding ROS 65. The contents at the location defined by the address register include $b(a_i)$, C/C, $b(a_j)$ and C/C. As may be recalled, there is a one bit indication accompanying each $b(a)$ indicating whether it represents a character transmitted in the clear or compressed, i.e., C/C.

Selection networks 68 consist of registers and selectors for insuring that a preselected one of the two $b(a)$'s contained in register 67 is placed on path 25'. This, in turn, is dependent upon the binary value of state signal "g" obtained from controller 51' over path 21'.

Each derived fixed length word $b(a)$ is applied to an encoding ROS 33' in logic and state controller 51'. This permits the decoder 53 to be in the same state as that of the encoder when a given variable length $c(a)$ or transmitted fixed length character was applied to path 49. Consequently, the state $g$ on path 21' should be identical to that of the encoder at the point in time when $c(a)$ was selected to represent a corresponding fixed length code word $b(a)$.

ENCODING
Initial
State = 1

|  | 1 | 2 | 3 | 4 | 5 | 6 | 7 | 8 |
|---|---|---|---|---|---|---|---|---|
| b(a) | 5 | 6 | 0 | 1 | 0 | 1 | 1 | 1 |
| Next State | 1 | 1 | 2 | 3 | 4 | 5 | 5 | 5 |
| Alphabet | $A_2$ | $A_2$ | $A_2$ | $A_2$ | $A_2$ | $A_2$ | $A_1$ | $A_1$ |
| c(a) | 0 | 10 | 111000 | 111001 | 111000 | 111001 | 01 | 01 |

DECODING
Initial
State = 1

| c(a) | 0 | 10 | 111000 | 111001 | 111000 | 111001 | 01 | 01 |
|---|---|---|---|---|---|---|---|---|
| Alphabet | $A_2$ | $A_2$ | $A_2$ | $A_2$ | $A_2$ | $A_2$ | $A_1$ | $A_1$ |
| Next State | 1 | 1 | 2 | 3 | 4 | 5 | 5 | 5 |

-continued

| b(a) | 5 | 6 | 0 | 1 | 0 | 1 | 1 | 1 |
|---|---|---|---|---|---|---|---|---|

TABLE 2

The above table 2 illustrates the operation of encoder 51 and decoder 53.

Referring now to all of the drawings, let us first examine encoding action and assume that state controller 23 is in initial state 1 with $b(a) = 5$. From FIG. 3A, the corresponding path is j. This, in turn, means that the next state as shown in FIG. 1B is state 1 with the character being encoded in alphabet $A_2$ where $c(a_j) = 0$. For the new character $b(a) = 6$ and the present state being 1 with $g = 1$, then the path from FIG. 3A is $s_j$ which from FIGS. 1B and 2 means that the next state is 1. Also, from FIG. 3A, the alphabet is A2 with $c(a_j) = 10$ with a length of L = 2.

The third fixed word $b(a) = 0$ with $g = 1$ means that from encoding table in FIG. 3A, the path to the next state is $S_i$ and that the text will be transmitted in the clear with a prefix 111 followed by 000. From FIGS. 1B and 2 given a present state of 1 with $S_i$, then the next state is 2. The remainder of the encoding table can be verified by the same procedure.

Referring now to the decoding table in table 2, assuming that the decoder 53 has received on path 49, $c(a) = 0$. From the decoder ROS contents shown in FIG. 3B, it may be observed that three bits are used to address the ROS. Thus, for 000 n, then $b(a) = 0$ or 5. This ambiguity can be resolved by recourse to the fact that the output from controller 23' is state g which we will assume = 1. This yields $b(a_j) = 5$ and the path to the next state is j. Referring now to FIGS. 1B and 2, the next state is 1, the state value $g = 1$, and the alphabet is A2. The remaining portions of the decode table can be confirmed by repeating the above procedure.

While the invention has been particularly shown and described with reference to a preferred embodiment thereof, it will be understood by those skilled in the art that changes in form and details may be made therein without departing from the spirit and scope of the invention.

What is claimed is:

1. An apparatus (5) of the type having output means and means for generating variable length codewords $c(a_i)$ and $c(a_j)$ responsive to corresponding fixed length codewords $b(a_i)$ and $b(a_j)$, where $a_i$ and $a_j$ are source alphabet characters and where $a_i \epsilon A_1$ and $a_j \epsilon A_2$; comprising in combination:

a Markov processor (FIG. 2; FIG. 5-1,21,23,41) for resolving ambiguities by character sequence context recognition arising whenever any ones of a sequence of fixed length characters to be encoded can represent different source characters $a_i$ and $a_j$ drawn from dissimilar alphabets $A_1$ and $A_2$, said processor including:
   an r state register (7);
   state transition means (23) responsive to a control signal ($S_i$ or $S_j$) for changing a given present state of the register to one of a preselected number less than r next states (9, FIGS. 1B and 1C), said state transition means including means (9, 11, 19) for generating a second control signal signal (g);
   means (31, 33, 35, FIG. 3A) responsive to each fixed length codeword and coacting with said processor for generating an ordered m-tuple comprising at least two variable length codewords and a counterpart control signal ($c(a_i)$, $c(a_j)$, $S_i$ or $S_j$); and means (37, 3, 9) for selecting and applying one of the variable length codewords from the m-tuple to the output means according to the value of said second control signal (g), said means further including means (1, 41, 21) for applying the counterpart control signal ($S_i$ or $S_j$) to the state transition means.

2. An apparatus according to claim 1, wherein the state transition means comprises:
- a read only store (9) containing a state transition table indexed and accessible according to the contents of the r state register (7);
- a data register (11) for buffering the access next states according to the table;
- means (3) responsive to the first control signal ($S_i$ or $S_j$) for selecting the next state from the data register content and transferring said selected state to the r state register; and
- means (17, 19) responsive to the data register contents for generating the second control signal (g).

3. An apparatus according to claim 1, wherein the means for generating an ordered m-tuple, include:
- a memory containing a table of concordance such that at a location determined by a value for each fixed length codeword there exists two or more variable length codewords (($c(a_i)$, $c(a_j)$)) with corresponding length attributes (L) and a counterpart first control signal ($S_i$ or $S_j$);
- an address register (31) responsive to each fixed length character for accessing the memory;
- a data register (35) for storing the contents of the memory location addressed by the contents of the address register;
- an output shift register (47); circuit means (37) responsive to the second control signal (g) for selecting the variable length codeword and for transferring said selected codeword to the output register; and
- means (43) for shifting the contents of said output register that number of places as defined by the length attribute (L) corresponding to the selected variable length codeword.

4. In an apparatus (53) for generating fixed length codewords $b(a_i)$ and $b(a_j)$ responsive to corresponding variable length codewords $c(a_i)$ and $c(a_j)$, where $a_i$ and $a_j$ are source alphabet characters $a_i \in A_1$ and $a_j \in A_2$; the combination comprising:
- means (61, 63, 65, 67) responsive to each variable length codeword for generating an ordered m-tuple comprising at least two fixed length codewords;
- a Markov procesor (51') responsive to each fixed length codeword from the apparatus for emulating the internal state of a fixed to variable length encoder and for generating an alphabet selector control signal (g, 21'); and
- a selection and distribution network (68, 25') responsive to the control signal (g) for selecting the fixed length word from the m-tuple and applying said selected fixed length word to the apparatus output and also for applying said selected fixed length word to the input of the Markov processor so as to enable said processor to track the state-to-state transitions of the fixed to variable word length encoding apparatus.

5. In an apparatus according to claim 4, wherein the means for generating an ordered m-tuple of fixed length codewords includes a shift register (55); said Markov processor in addition to generating a control signal, also generates a length attribute (1) and means (40',57) for shifting the contents of said shift register by an amount proportional to the length attribute.

* * * * *